(12) United States Patent
Dittmer et al.

(10) Patent No.: US 12,063,022 B1
(45) Date of Patent: Aug. 13, 2024

(54) AUTONOMOUSLY MATCHING SIGNAL FREQUENCY TO LOAD RESONANT FREQUENCY USING SYSTEM POWER

(71) Applicant: Trudell Medical International, London (CA)

(72) Inventors: Andrew Dittmer, Woodstock (CA); Michal Fulmyk, Toronto (CA); Benjamin Russell, Oakville (CA); Bharanidharan Thamizhchelvan, London (CA)

(73) Assignee: TRUDELL MEDICAL INTERNATIONAL INC., London (CA)

( * ) Notice: Subject to any disclaimer, the term of this patent is extended or adjusted under 35 U.S.C. 154(b) by 187 days.

(21) Appl. No.: 17/722,785

(22) Filed: Apr. 18, 2022

Related U.S. Application Data

(60) Provisional application No. 63/176,036, filed on Apr. 16, 2021.

(51) Int. Cl.
G03G 15/00 (2006.01)
H03F 3/217 (2006.01)
H03H 11/30 (2006.01)

(52) U.S. Cl.
CPC .......... *H03H 11/30* (2013.01); *H03F 3/2176* (2013.01)

(58) Field of Classification Search
CPC ...... H03H 11/30; H03F 3/2176; G03G 15/80; H04R 1/1008
See application file for complete search history.

(56) References Cited

U.S. PATENT DOCUMENTS 9,007,785 B2 * 4/2015 Kosaka ................. G03G 15/80
363/16
2021/0321205 A1 * 10/2021 Akers ................. H04R 1/1008

* cited by examiner

*Primary Examiner* — Cortez M Cook
(74) *Attorney, Agent, or Firm* — Crowell & Moring LLP

(57) ABSTRACT

A system and method for use in matching a source to a dynamic impedance electrical load is described. The system may include a processor that controls a signal generator to sweep across a frequency spectrum to locate a resonant frequency of the dynamic impedance load. The determination of resonant frequency may be made based on sensing the power consumption of the amplifier supplying the load and locating the frequency at which the power consumption is minimized. Periodically tracking and adjustment of the frequency to maintain a minimum power consumption may be automatically performed. The load may be a SAW atomizer.

19 Claims, 6 Drawing Sheets

AUTONOMOUSLY MATCHING SIGNAL FREQUENCY TO LOAD RESONANT FREQUENCY USING SYSTEM POWER

CROSS-REFERENCE TO RELATED APPLICATIONS

This application claims the benefit of U.S. Provisional Patent App. No. 63/176,036, filed Apr. 16, 2021, the entirety of which is hereby incorporated herein by reference.

FIELD OF THE INVENTION

The present disclosure relates to a system for matching signal frequency to load resonant frequency using system power, and more particularly to a system for adapting to a dynamic load, such as in a surface acoustic wave (SAW) atomizer circuit.

DETAILED DESCRIPTION

Figure 1:
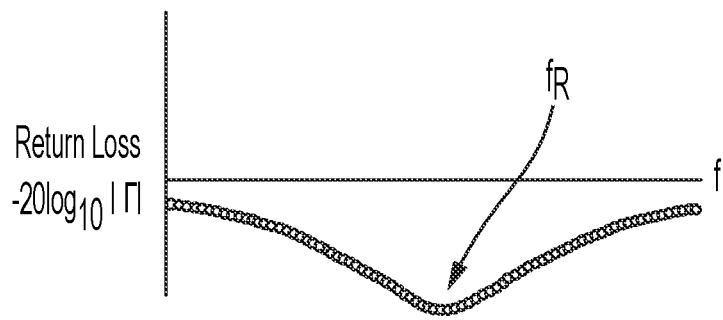
FIG. 1 is an example of a typical return loss profile for a surface acoustic wave (SAW) atomizer.

Atomizers are devices that shear bulk fluid into discrete droplets for a variety of applications, such as medical nebulizers, fuel injectors, perfumes, cleaning products, etc. Because the natural state (the lowest energy state) of fluid is as a bulk, work must be done to break it down and it will always try to agglomerate. There are different ways to break up a fluid, in general the surface is disturbed to produce a thin column of fluid (jet), and when the conditions are right (Weber's #>1, i.e. fluid kinetic energy>>Surface energy), the tip of the column is separated from the bulk of the fluid. For smaller droplets, satisfying the critical Weber number becomes increasingly difficult as the mass of the fluid is proportional to the diameter cubed, while the surface energy is proportionally squared. In other words, the diameter affects the numerator more than the denominator, and so to keep the ratio above the critical value the velocity must get respectively higher. For very thin columns of fluid, vibrations in the fluid help out with break up, as harmonic perturbations will quickly grow and lead to contractions that eventually allow the tip of the fluid column to be pinched off (Rayleigh plateau instability).

The goal of any commercial atomizer is to efficiently provide aerosol droplets within a desired size range without damaging the contents of the fluid. An additional criterion exists for pressure sensitive systems (such as in a respiratory circuit), where deviation in pressure can be catastrophic. Solutions with minimal impact, i.e., those that deliver only the aerosol, are preferred because the displaced volume of the fluid is negligibly small with respect to the system volume and avoids the need for intervention (human or AI) to accommodate it. In some cases, controlling the rate of delivery is also pertinent, for certain medical applications the treatment time is seen as proportional to the monetary cost, but rate control can also be significant for balancing medication bioavailability, metabolism and side-effects.

Medical nebulizers are a specific application of an atomizing device that nebulize a fluid into an aerosol for inhalation by a patient. Medical nebulizers are well-known devices commonly used for the treatment of certain conditions and diseases. Nebulizers have applications for conscious, spontaneously-breathing patients and for controlled, ventilated patients.

There are multiple technologies that are commonly used to produce an aerosol: pneumatic (low velocity fluid and high velocity air), hydraulic (high velocity fluid and low velocity air), mesh (vibration or static), free surface (ultrasonic, Surface Acoustic Wave (SAW)), spinning (centrifugal), electrostatic, and Fourier horn. SAW nebulizers use surface acoustic wave (SAW) technology. SAW nebulizers, which are a type of resonant acoustic micro-electromechanical systems (RA-MEMS) actuator, operate on a principle of introducing high frequency vibrations into a crystalline substrate whereby liquid medication is delivered to the surface of the vibrating substrate. Energy transfer occurs at the liquid-surface interface and is sufficient to shear the liquid medication into aerosol particles.

While SAW technology has been in existence for some time, as applied to nebulization it has been a challenge to provide a cost-effective solution while achieving the required aerosol quality and output rate necessary to be suitable for general purpose nebulizer treatment. Multiple challenges exist in SAW nebulizer systems, such as how to achieve an acceptable level of efficiency.

A periodic electric field transfers power to a load more efficiently when the load impedance ($Z_L$) is well matched to the source impedance ($Z_s$) (where matched refers to when the impedances (they are complex conjugates) are equal in magnitude); for example, in an implementation of a 50 Ohm system, matching $Z_L$ to roughly within 10 Ohms of the source (e.g., achieving a load impedance of 40-60 Ohms in a 50 Ohm system). When a circuit's impedance varies with frequency, the frequency corresponding to the lowest mismatch (and lowest reflections ($\Gamma$)) is the electrical resonant frequency "$f_R$", see FIG. 1. An ideal match requires a net reactance of zero (source and load are equal but opposite) and equal resistances of the source and load.

For a piezoelectric load, the resonant frequency is strongly dependent on how the electric field is presented to the piezo material. In a SAW device for example, the field is presented using interdigitated transducers (IDT) on or near the surface of the piezoelectric substrate. The IDTs spacings dictate the sound wavelength ($\lambda$) and substrate material dictates the intrinsic wave velocity (u), the two parameters determine the resonant frequency ($f_R$):

$$f_R = u/\lambda$$

Because u and $\lambda$ are physically fixed, SAW devices have sharp resonant peaks (narrow bandwidths), meaning the impedance can change significantly over a small frequency range (>10% reflections for <0.35% change). The position of this sharp peak can also become dynamic when the IDTs thermally expand and change the wavelength, this phenomenon is characterized by the temperature coefficient of frequency/delay (TCF/TCD). Other external (fluid, pressure, wear) and manufacturing variables can also influence the position of the peak.

For a SAW atomizer, an impedance mismatch will negatively impact the SAW amplitude (>1 nm typically needed) and droplet formation. The SAW atomizer also risks being overwhelmed by the fluid supply (flooded) if there is an impedance mismatch. In general, a mismatch also leads to more energy being dissipated in the source (inefficiencies/heat), and risks damaging electronic components (heat & higher voltages)

The narrow and dynamic resonant peak, and the consequences of mismatch, can lead to a problem: SAW devices, particularly in higher power applications like atomizers can quickly become mismatched and fail using a source with a static signal.

There are several existing attempted solutions to this problem, however they all have drawbacks.

SAW Design Solutions: There are several existing methods that address the dynamic nature of SAW devices at the device end: Chirping (IDT spacings are varied), temperature control methods, passivation layers (SiO2) to counter TCF, alternate substrate materials with zero TCF, but ultimately lead to higher cost, efficiency losses and complexity.

Electronic Sensing of Resonance: Vector network analyzers (VNA) can determine the resonant frequency by monitoring signal reflections but are sensitive and may become damaged by high power applications like SAW atomizers.

Electronic Adaptation to Resonance: A source with an adaptive signal frequency can accommodate the dynamic resonant frequency and avoid the complications of mismatch. A source that adapts would improve power transfer efficiency, reliability, yield (by accommodating wider manufacturing tolerances), and overall performance of the system (atomization rate increase, battery footprint reduction).

One adaptive solution has been developed by Belektronig, specifically for SAW actuators application. The device scans and reads reflections (internal VNA) periodically to determine the resonant frequency (See section three of the linked paper for details). The device is capable of servicing a wide frequency range of SAW devices, but is limited in output power (<4 [W]), is large (lunchbox size) and is cost prohibitive for SAW atomizer consumers (>$15,000).

In order to address the drawbacks of existing efforts to solve load matching issues for SAW device loads, embodiments are described below that may provide cost effective, compact and accurate load matching. Interpreting system power of a periodic circuit is typically complicated by the need to understand the effects of each circuit block, how they interact, and their effects on the resonant frequency.

Figure 2:
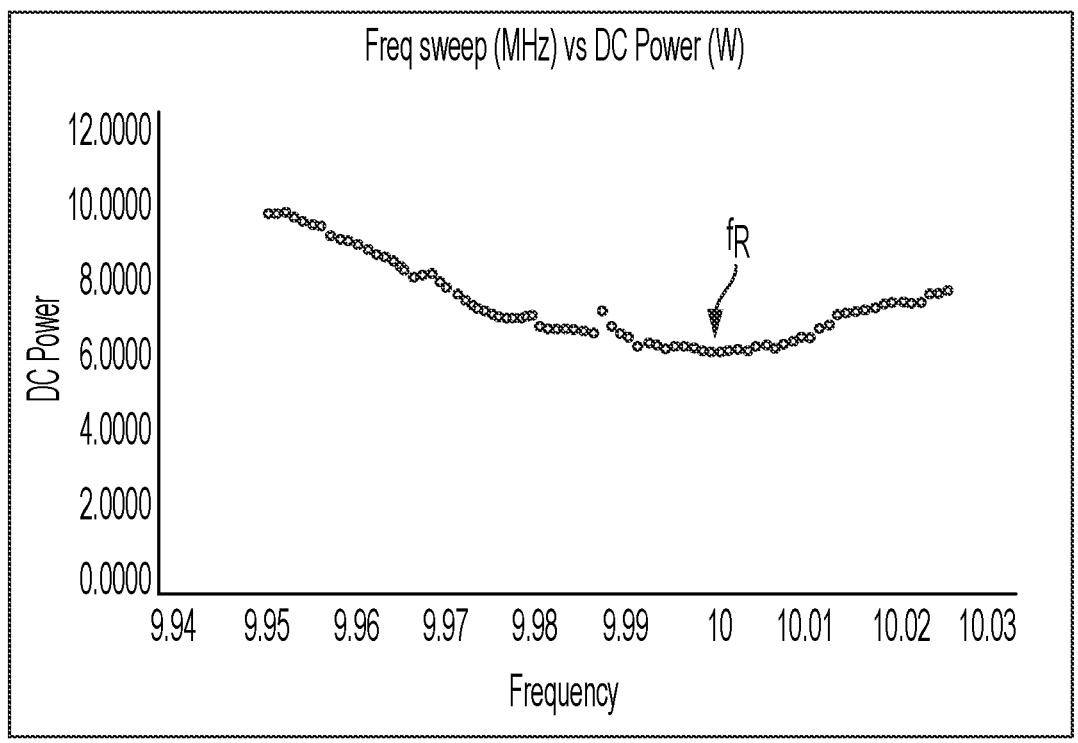
FIG. 2 illustrates an expected power versus frequency plot for a surface acoustic wave (SAW) atomizer system.

However, observing that in a system where the load's impedance depends on the frequency, and where the source efficiency is insensitive to frequency but sensitive to load impedance, then changes in power that result from changes in frequency can be attributed to the impedance mismatch of the load. The frequency that yields a minimum power is the frequency where impedance is most closely matched to the electrical resonant frequency $f_R$, as shown in FIG. 2. As seen in the example of FIG. 2, changing the frequency and comparing power measured at the source (amplifier) supplying the load before and after the change, indicates whether the new frequency is closer to the resonant frequency. Repeatedly biasing frequency changes in the direction of diminishing power will ultimately converge on the resonant frequency. One suitable method is called a "hill climbing" algorithm and may be implemented in one embodiment to allow the source to automatically achieve improved efficiency when driving a dynamic load such as a SAW atomizer load. A "maximum power point tracking" technique for iterating towards efficient matching may alternatively be implemented in other embodiments.

Figure 3:
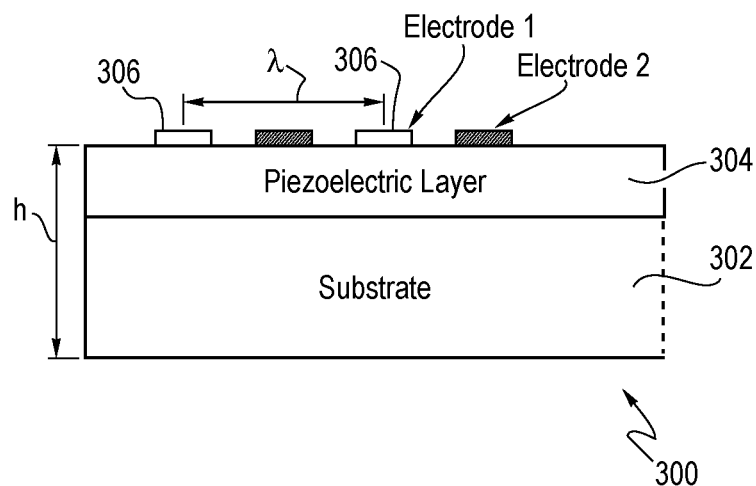
FIG. 3 illustrates one example of a SAW atomizer structure.

Referring to FIG. 3, a SAW atomizer 300 may be formed from a substrate material 302 on which a piezoelectric layer 304 is formed having multiple electrodes (also referred to as IDTs) 306 positioned thereon.

Figure 4:
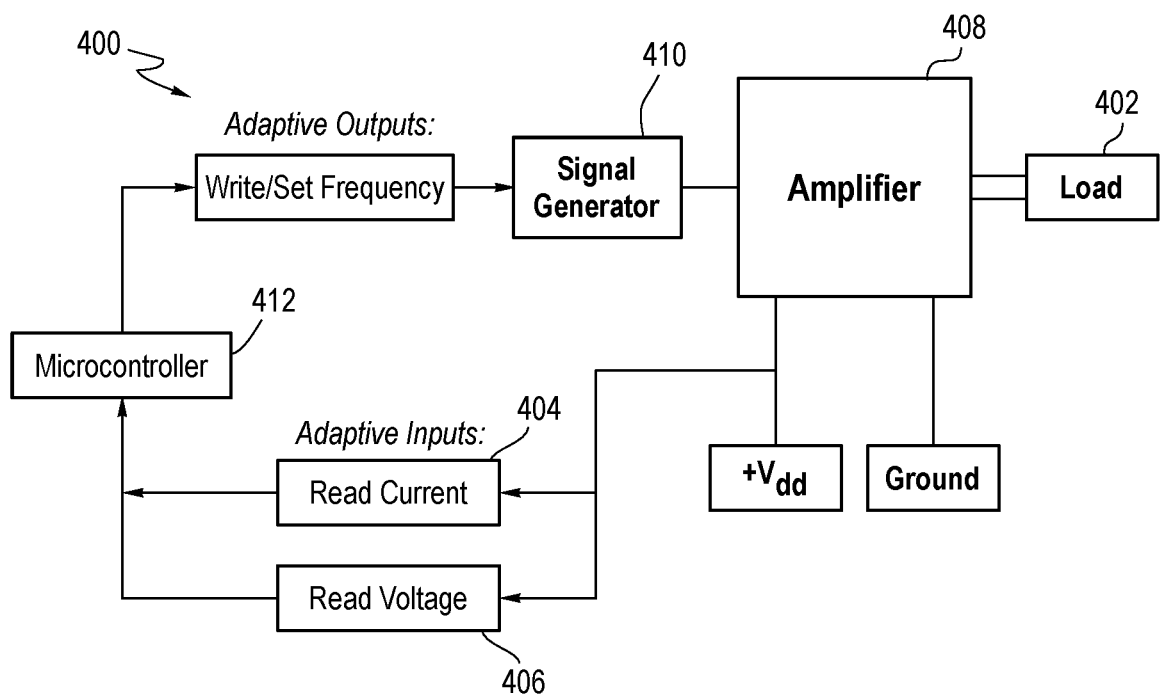
FIG. 4 is a block diagram of a system for matching a source to a dynamic load such as a SAW atomizer according to one embodiment

Referring to FIG. 4, a system 400 for automatically matching the impedance of a source driving a dynamic load 402 such as a SAW atomizer 300 is described according to one embodiment. The system includes current and voltage sensors 404, 406 to read the power being supplied (+$V_{dd}$) to the amplifier 408, a variable oscillator (part of signal generator block 410 shown) to generate the signal for the amplifier 408, and a microcontroller 412 to handle the logic. The block diagram in FIG. 4 shows where input/output data is being read/written.

Figure 5:
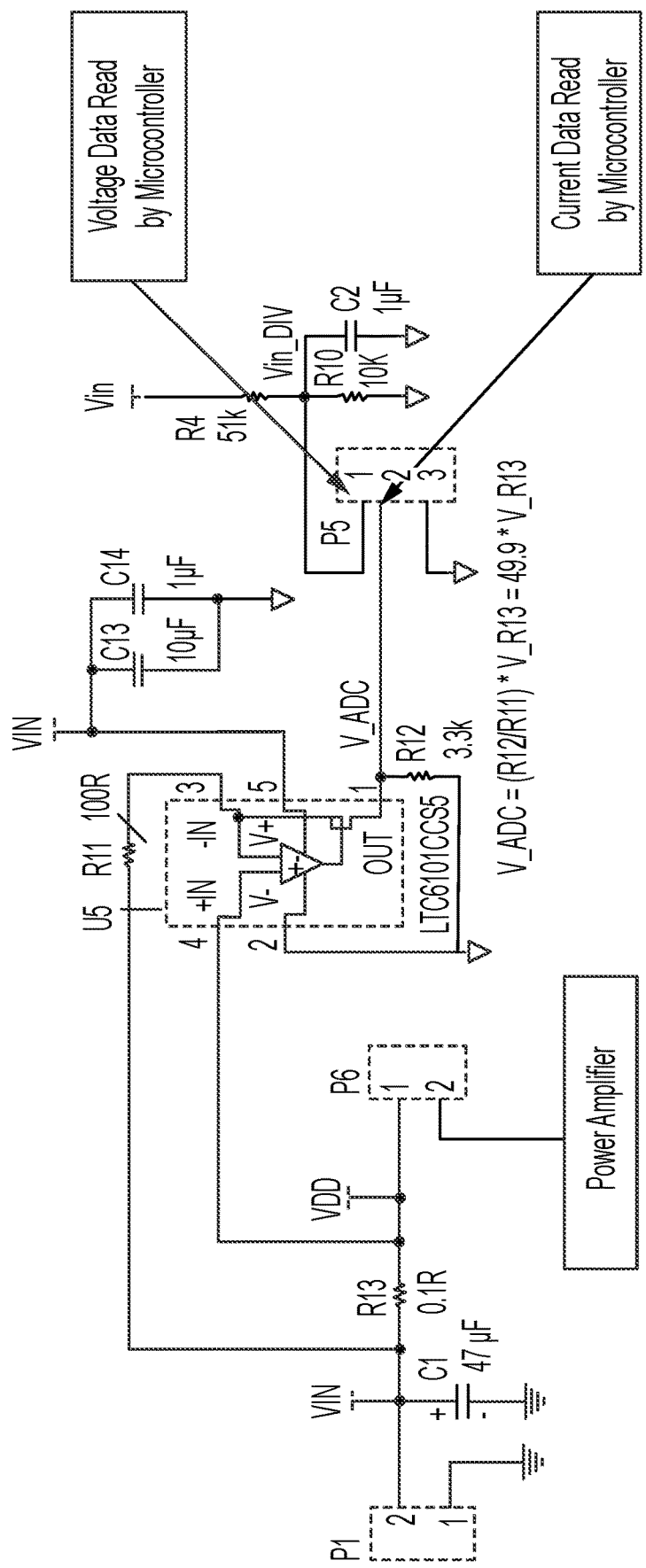
FIG. 5 is an example of one circuit for measuring amplifier input Vdd supply voltage and current shown in FIG. 4.

An example of a more detailed view of an embodiment of the circuit 500 which may be used to measure the amplifier $V_{dd}$ supply voltage and current is found in FIG. 5. The circuit 500 may be part of the amplifier circuit 408 of FIG. 4, or may be a discrete circuit connected to the $V_{dd}$ supply. The amplifier voltage and current reading circuit outputs voltage data and current data that is read by the microcontroller 412 of FIG. 4 to adjust the frequency of the signal generator that is amplified by the amplifier and sent on to the load.

Figure 6:
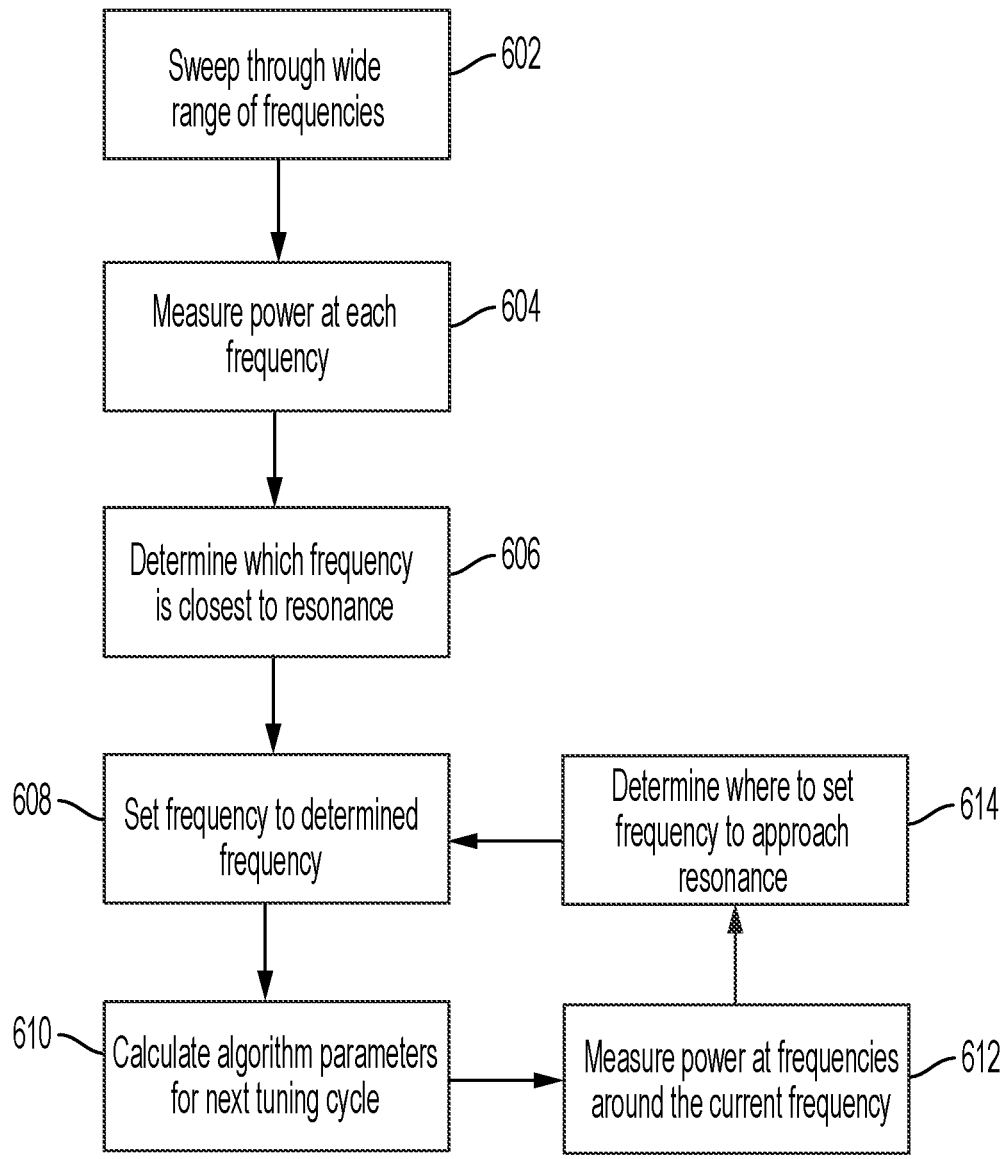
FIG. 6 is a flow diagram illustrating a method of automatically matching a load by determining a resonant frequency and then maintaining the matching by monitoring and adjusting for subsequent variation of the resonant frequency.
Figure 7:
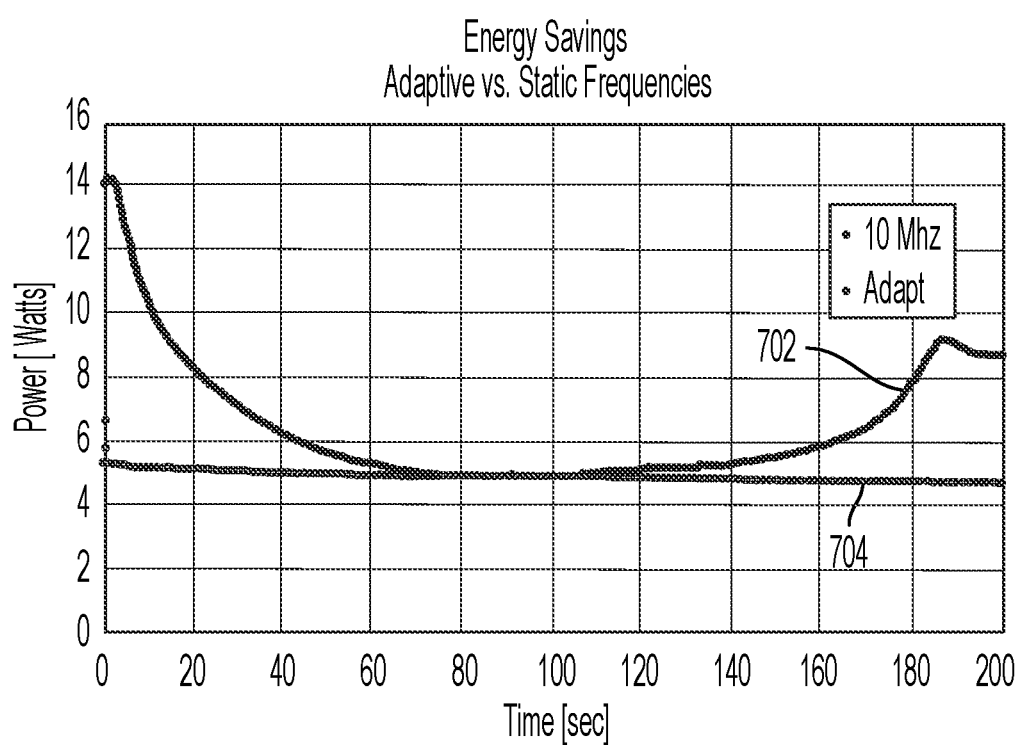
FIG. 7 is an example of the potential energy savings achievable using the method of FIG. 6 rather than a static frequency generator.

Referring now to FIG. 6, an embodiment of a method of utilizing a system, such as illustrated in FIGS. 4-5, to autonomously and automatically match a dynamic load (e.g., a SAW atomizer) to a source (e.g. signal generator and amplifier circuit) is shown. The microprocessor of the system may instruct the signal generator to cause the variable oscillator to sweep through a range of frequencies (at 602) and measure the power used by the amplifier at each of those frequencies (at 604). As described in more detail below, the frequencies may be stepped in discrete amounts as instructed by the microprocessor. In one embodiment, the frequency range of the initial frequency sweep at start up may be a predetermined frequency range. Based on the measurements made by the microprocessor via the current and voltage data supplied by the voltage and current sensing components (for example, the embodiment of FIG. 5) of power supplied from $V_{dd}$ to the amplifier at each of the frequencies, the microprocessor then determines which frequency came closest to resonance and sets the frequency supplied by the signal generator to that determined frequency (at 606, 608). The microprocessor then calculates algorithm parameters for a next tuning cycle and measures the power detected at a set of frequencies around the current frequency setting (at 610, 612). The further measurements at step 612 may then be used to determine whether to set the frequency to approach resonance (at 614) and then steps 608-614 are repeated while the system continues to operate so that the load matching may be maintained as close as possible. The determination of when the SAW atomizer load is at resonance may be based what frequency from the signal generator yield the lowest power consumption by the SAW atomizer load, as is illustrated by $f_R$ on the example chart in FIG. 2. As the operating parameters (temperature, amount of fluid at the SAW atomizer, etc.) change over time, the location of $f_R$ may change and the repeated process of FIG. 6 may continually seek out and locate the new frequency at which the load is best matched.

The method illustrated in FIG. 6 may be incorporated as firmware or software logic in memory on or separate from the processor. The method causes the microprocessor to the input current and voltage readings and make autonomous decisions on how to set the output frequency and when to set it. This approach relies on observing the effects/trends of power in relationship to frequency, but to know if the current frequency is correct it much check other frequencies nearby (for example, in <20 kHz increments, but in smaller increments such as 1 kHz in other embodiments). To maximize efficiency over time, the algorithm must weigh the accuracy vs. speed of matching/adapting the output frequency to resonant frequency of the load.

One circumstance where speed (e.g. larger frequency steps) is important is when a load is first connected, and the search domain is large, other circumstances include external factors during operation that make the load highly dynamic such as heat or dampening of the SAW device (fluid added). Once the system begins to converge on the resonance and the system enters a steady state of operation prioritizing accuracy may become more beneficial to efficiency goals. In one embodiment, the balance of priority between speed and accuracy will thus change with circumstances; speed is important when far from the resonance, while when near resonance, prioritizing accuracy is more beneficial. Fewer and larger steps will help cover more ground when speed is required, and frequent and small steps will serve the need for accuracy. In one implementation, the determination of whether the circuit is near or not near resonance may be made based on any of a number of criteria, for example the microprocessor may decide the circuit is nearing resonance based on the slope of power consumption change per frequency change increment dropping below a predetermined value. The microprocessor may switch from a larger frequency step to a smaller frequency step when the measure power change per frequency change drops below a certain amount and vice-versa.

Maximizing efficiency gains will depend on minimizing net time and delta away from resonance. A suitable algorithm, such as described in FIG. 6, may employ an adaptive step size technique and can attune to within a few kilohertz of the predicted resonance re-tuning every 250 ms. As noted above, the version of tracking resonance set forth in FIG. 6 is in the form of a "hill climbing" type of algorithm. Other algorithms for using the measured amplifier supply current and/or voltage data to track and converge on resonance are also contemplated.

In one implementation, the amplifier of FIG. 4 may be a highly efficient (>70%) class E-amplifier, and the load may be a 10 MHz SAW device (for example, a piezoelectric substrate SAW atomizer). Although other amplifier designs are contemplated, a class-E amplifier may be less sensitive over the dynamic frequency range of the SAW device and, in combination with the adaptive method described below, may assist in keeping the impedances of the source and load matched. Class-E amplifiers are not typically considered as insensitive to frequency nor appropriate for loads with dynamic resonance (varying impedance). Also, class-E amplifiers can have a heightened risk overheating their transistors when a mismatch does occur. Without the ability to adapt, the class-E would constantly depend on protective mechanisms to prevent permanent damage, likely disrupting performance. Accordingly, in one implementation, protective mechanisms may be added to the circuit of FIG. 4, such as current, power and transistor temperature rules, to disengage power and protect the circuit when the amplifier circuit is not in the adaptive mode described in FIG. 6 above.

Referring to FIG. 7, one example for a contemplated SAW device response to the method and system described herein can be seen. The example of FIG. 7 shows the potential significant power savings that may be produced by employing the adaptive controller and method. In this example, a SAW device with an initial resonant frequency of 10.032 MHz was driven for over three minutes, over which time the resonant frequency changed as the SAW device temperature increased. The upper, concave curve 702 is the power profile for a static controller circuit where a signal generator generates a constant 10 MHz signal, and the lower, more linear curve 704 on the chart represents is for the disclosed adaptive controller system such as the embodiment of FIGS. 4-6 where the frequency from the signal generator is controlled to track resonance based on measurements of power supplied to the amplifier. The area between the two curves represents the energy savings, and heat reduction in the controller and load. Note that only for an instance as the load resonance passes through 10 MHz, are their efficiencies equal.

Use of amplifier input power (FIG. 2) to track resonance, may not only be effective in applications where the load is a SAW atomizer, it is potentially also helpful for other electronic circuits with dynamic loads. The ability to track and adapt as disclosed herein may help to improve power efficiency, costs, reliability, safety, and performance and avoids the typical need to constantly check and compensate for resonance mismatches.

Further discussion and other embodiments of optimizing performance of a SAW atomizer, including embodiments that may be used in combination with, or independently from, the embodiments disclosed above are supplied below.

Adaptive Frequency Control

SAW technology is widely used in many industries but in the application of atomization there are unique challenges which must be overcome and are not evident in the prior art:

SAW devices only operate when the electrical source frequency matches the mechanical resonant frequency of the die; they should be aligned for the system to operate with efficiency. While SAW technology is widely used in other applications in an efficient manner, the application of SAW as an atomizer poses significant challenges to achieve a highly energy efficient system. Manufacturing variables of the die, and the operating conditions of the atomizer which includes ambient temperature can change the resonant frequency and lead to poor efficiency or a non-functioning device (i.e., SAW devices have tight tolerances and are sensitive to external stress).

SAW Atomizer:

Manufacturing variables include the die crystal and surface properties (intrinsic and extrinsic), IDT pattern geometries, and any residual stresses due to assembly. Operating variables include driving voltage, die temperature and external stresses (mass loading). Wear (degradation of metal sputter layer), both the IDTs and the atomizing region can also change the resonant frequency.

Additionally, heat generated by the SAW device during atomization at sufficiently high atomization rates can increase the temperature of the substrate. Some of the heat generated by the SAW atomizer can be dissipated to the liquid being atomized, to the air in the surrounding environment, or through direct contact with the substrate by elements within the SAW atomizer design (e.g. heat sinks or cooling apparatus). While effective heat management approaches will help minimize temperature increases, the ability to offset the effect of temperature rise on the mechanical resonant frequency without significant and costly cooling apparatus would be advantageous. Lastly, while consistent fluid delivery to the SAW atomizer provides for consistent aerosol generation, different delivery rates may be beneficial depending on the application where a faster or slower rate of fluid flow may be desirable. As well, there will be natural variation in the rate of flow due to manufacturing and design variables within the fluid delivery system. The flow rate changes will affect how much heat is transferred from the surface of the substrate and therefore the temperature of the substrate if the changes in heat transfer are not somehow compensated for elsewhere in the design.

Manufacturing processes of SAW atomizers may be improved over time but mitigating the current state-of-the-art sensitivity to operating variables and wear will likely be more difficult and costly. For example, the device's sensitivity to temperature (thermal strains) may be reduced with new materials, layering, IDT patterns, or heat management systems. The sensitivity to placing fluids in the wave propagation path given the desired range of treatment rates (mass loading, cooling effects) and medications (fluid properties: conductivity, viscosity, heat capacity, surface tension), may be offset through more research and controller sophistication. The tendency to wear may also be improved by new materials, and layering.

Degradation of the metalized surface, and/or the base substrate material during use may also cause changes in acoustic performance. De-metallization changes the surface conductivity and increases the SAW velocity, IDT degradation can also change the die's resonance and its Q-factor. Wear or ablation of the IDT's is a result of contact with the fluid during atomization; believed to be due to the high Gs of the surface wave and the surface tension with the fluid. Changes in the IDT's or surfaces contacting the fluid during atomization may have a direct impact on the acoustic performance of the SAW atomizer and may change as the device breaks in or wears through use.

Higher output voltages are required by a fixed frequency signal generator to drive a mismatched SAW atomizer, additionally the signal reflections would increase the heat dissipated in the controller. Each of these conditions would impact the electronic hardware and may become more complicated, larger, or costly as a result. As well, portable applications are preferred which would be impacted by larger hardware required to handle higher power demands as well as the impact on battery size and weight. One method discussed herein for reducing power demands is to take advantage of the Temperature Coefficient of resonant Frequency (TCF). The TCF is a parameter which indicates the thermal stability of the resonator and indicates how much the resonant frequency drifts with changing temperature.

When a SAW nebulizer system is properly tuned, not only does the nebulizer perform better because it is operating at its resonance but the controller output voltages can be reduced allowing it to be smaller and cheaper, and simpler to design and manufacture. Thus, it is important to have a system that is tuned. However, achieving this with a fixed frequency controller given the number of variables that affect the resonance of a modern SAW atomizer is costly and complex.

There are different methods to determine the resonance of a SAW device, most of them rely on the voltage standing wave ratio (VSWR) of the signal wire and would be cost prohibitive for the customers of atomizers. Described herein is a method for frequency tuning that utilizes the DC input supply of the signal generator. Specifically, we monitor the current and voltage values and seek to minimize the DC input power draw while adjusting the output frequency. This approach relies on a die manufacturing process that yields a single decisive resonant peak within the controller's search window and a consistent low strain assembly method (die attach and gasket) to minimize distortion of the peak, and a signal generator (incl. power amplifier) that is insensitive to frequency over a domain wide enough to accommodate residual the manufacturing, operating and wear variables that effect SAW resonance. In a preferred embodiment, the controller can scan and quickly determine the ideal operating frequency for a given SAW device that is connected to it.

A startup routine may be utilized whereby a chip first connected to the controller may enter a targeting mode which utilizes low power but still allows the controller to identify the minimum DC input power draw and the resonant frequency. In this embodiment the initial targeting is done prior to nebulization start and when in a low power mode to conserve energy and to ensure that optimal atomization is achieved the instant it is desired. An algorithm will dynamically assess the power conditions and then zone in on the desired resonance. A system that can do this responsively and quickly is preferred so that as conditions change, or when first starting up, that the system quickly and consistently identifies the desired resonance even under changing input variables. Although not required, in one embodiment, the system may benefit from an algorithm that may also have learning capability, for example a machine learning/artificial intelligence algorithm where trained models are generated. The algorithm may consider different variables attributable to a specific SAW device and then would know when it is required to operate that specific SAW device again. The algorithm would automatically select optimal inputs required to achieve the resonant frequency. This would have advantages in avoiding the need for an initial targeting phase if the SAW device is one the controller has been connected to before.

For SAW atomizers, performance efficiency can be described as 1) insensitivity to frequency change (wide bandwidth) and 2) highly sensitive to changes in load (fluid). SAW devices in general can be considered as narrow bandpass devices that are highly variable to frequency, that by design, have electrical and mechanical resonant frequencies that are the same. An amplifier and load paring with these characteristics mean that when the frequency is changed, any measured change in power is attributable to a change in load (changes in fluid) and not the internal workings of the amplifier. In the case of a well-designed SAW device, maximum system efficiency will occur at its mechanical resonance.

In an alternate embodiment, the SAW device could be evaluated at the point of manufacture for SAW resonance. The ideal parameters to achieve resonance for that particular SAW device could be programed onto some form of readable form which would be read by the controller when it is connected to it. The information contained onto the readable form would be such that the controller would input that into a control algorithm and that would immediately allow it to identify the resonance frequency or get closer to it so that the search window of the controller can be kept small. Options would be some form of programmable memory like an erasable programmable read-only memory (EPROM) which once connected to the controller can be read. Other options include wireless devices like radio-frequency identification (RFID) which could communicate the required variables to the controller over a wireless communications protocol. It is contemplated that there would be alternate methods for conveying ideal operating parameters for a given SAW device to the controller.

As explained earlier, temperature affects the resonant frequency of the SAW atomizer. While the above solution ensures optimal targeting of the resonance within expected conditions, the same approach can detect when other variables not accounted for may be affecting the SAW atomizer. For instance, in the event ambient conditions experience extreme temperature rise or there is a heat source near the SAW device that raises its temperature beyond expected conditions, the resulting change in resonance may be identified by the controller as abnormal and indicate that the SAW device is overheating. This could be an important safety feature preventing damage to the SAW device. It can be appreciated that other reasons could cause overheating which includes a failure of any auxiliary cooling devices, a defective SAW device, manufacturing defects, or any number of other causes resulting in excess heat in the SAW device.

One alternative embodiment disclosed herein for frequency tuning leverages a correlation between the minimum DC power, the peak to peak voltage (Vpp) and the device's resonant frequency. This is made possible when the electrical impedance of the SAW atomizer at resonance has been matched to the controller (e.g. 50 Ohms). In this solution, Vpp is monitored while varying the signal's frequency and holding the power constant. At mechanical resonance, when the controller and SAW atomizer frequencies are aligned, the voltage standing wave ratio (VSWR) and the Vpp measurement will be at a minimum. This relationship enables the continuous monitoring and targeting of the resonant frequency of the SAW atomizer where atomization at the resonant frequency leads to optimized atomization rate.

A controller is proposed herein that can monitor the DC power while simultaneously adjusting the signal frequency to minimize power consumption and locate the resonant frequency. The solution may include a current sensor and a voltage divider circuit that would be read by the controller to calculate the DC power being consumed by the system. Like the embodiment above, no extra components or electronics are required to be added to the device. By monitoring the essential performance of the SAW atomizer, the solution proposed leverages base technology without adding anything to specifically detect resonant frequency or any of the number of variables that can affect resonant frequency. This has an advantage for overall system simplicity, efficiency, reliability, and cost. It is also an advantage because it is most indicative of the true performance of the SAW atomizer and most strongly correlated to atomization rate.

In some implementations, sensing the minimum may difficult due to it being a set of conditions that require fine resolution to detect, and second, the offset between SAW atomizers has been found to be inconsistent across devices. This may require each device to communicate their offset to the controller somehow (user input, or a clever electronic solution). Reducing Vpp sensing method to practice would employ an envelope detector on the AC signal to monitor the Vpp and inform a microprocessor, such as microcontroller 412. An envelope detecting method is further disclosed as in the next section as a means to detect fluid presence in the atomization area of the SAW atomizer.

Fluid Detection

For several reasons, it may be desirable to only power a SAW atomizer 300 when fluid is present on the die. Foremost, is to mitigate the temperature rise of the die, the natural cooling effect of the fluid is significant. Also, since the bulk of the system power is allocated to exciting the chip, this approach will conserve energy.

If coordination of power and fluid is accomplished by sensing the fluid presence (vs. synchronizing with the fluid supply) further value can be added to the system including controller versatility, making it more compatible with external fluid supplies and enabling automatic dose tracking and help with troubleshooting device errors. Unfortunately, for the application of atomization, adding the weight, cost, and reliability concerns of sensors at the device end, most sensing solutions are not suitable.

A purpose of a SAW atomizer 300 is to transfer mechanical energy in the form of acoustic vibration at the surface of the substrate into the fluid that comes into contact with the surface of the substrate which is sufficient to atomize the fluid. When the fluid is not present and the SAW atomizer is receiving the amount of power necessary to successfully atomize fluid, this mechanical energy has nowhere to go. The result is a rapid buildup of heat that would normally be transferred to the fluid during the atomization process. This heat buildup if not managed can rapidly produce temperatures at the surface of the substrate in excess of 40 degrees C. This may produce undesirable reliability issues, poses a safety risk, and may cause degradation of the fluid. Delivering power only when there is sufficient liquid present for atomization is equally critical in order to ensure overheating is prevented. As well, linked to above problem statements regarding power efficiency, energy delivered to a SAW atomizer that is not ready to atomize, in the case where there is no fluid to atomize, is wasted and contributes to overall system inefficiencies mentioned earlier. Ensuring the SAW atomizer 300 delivers energy to the fluid to be atomized at the right time and in the right way is essential for overall performance and effectiveness of the system. Solving this problem would also have tangible benefits to the user where delivery of the atomized fluid is optimized for when they need it. It can also inform feedback or notifications; for example, when the fluid has been consumed or if there is an issue with the fluid delivery system preventing or slowing fluid delivery.

In one embodiment for fluid-power coordination, to solve both problems of power inefficiency and heat management that could lead to undesirable excess heat, a fluid detection method is proposed. As fluid is introduced to the surface of the substrate, the voltage amplitude response of the oscillating wave changes. Generally, the voltage amplitude increases when fluid is delivered and can be approximated by the general acoustic dampening caused by the fluid in contact with the substrate. Fluid properties affecting this phenomenon can include the thickness of the fluid layer on the substrate, the area covered by the fluid in the atomization area, and the properties of the fluid itself including viscosity. It is proposed in one embodiment to use this response to determine when the fluid is present on the surface of the substrate. While the voltage amplitude of each frequency oscillation is indicative of the amount of fluid present on the substrate, it is impractical given the high frequency of oscillation to ascertain presence of fluid based on the individual amplitudes.

An approach that utilizes envelope detection methods may be more practical. An envelope detector can be described as an electronic circuit that takes a (relatively) high-frequency amplitude modulated signal as input and provides an output which is the demodulated envelope of the original signal. An envelope detector is sometimes called a peak detector. While variability in voltage amplitude from peak to peak may be informative and indicative of other phenomenon, it is the shift in amplitude over larger time segments that may be informative with respect to the presence or absence of fluid on the surface of the substrate. Standard envelope detection circuits can be applied. In this embodiment, due to the relative simplicity of deploying envelope detection approaches, simple, cost effective, and energy efficient electronics can be used. Demonstrated as a successful method for detecting fluid presence in a SAW atomizer, this is particularly advantageous as it also solves concurrent and related design goals which include power efficiency, small form factor, and low overall system cost.

More complex and inefficient systems can also be envisioned that would solve the same problem. This could include using other sensors to directly detect the presence of fluid on the surface of the substrate. A thermocouple could be integrated onto the surface of the substrate to detect changes in temperature as the fluid is introduced or changes. An optical sensor could be integrated that visually confirms presence of the fluid. Chemical detectors could be incorporated that detected presence of elements within the fluid itself. Other options exist but all would require secondary processing and power to drive additional sensor technology as well as the additional hardware itself. Utilizing envelope detection of the voltage amplitude response of the chip enables fluid detection by monitoring the base functionality of the SAW atomizer 300.

With the approach described above, response of the substrate to the presence of fluid may be instantaneous and proportional to the amount of fluid present. It is repeatable and the changes in amplitude are readily detectable by standard envelope detection methods and circuits. In application, this would allow the controller 412 of the SAW atomizer 300 to determine precisely when to shift from a low power or "standby" mode to a high power "atomizing" mode when the fluid is present in sufficient volume to commence atomization. This ensures one aspect of high efficiency is implemented in the system and ensures that power is delivered to the SAW atomizer 300 only when it is needed and can be converted into atomized fluid. The start of atomization can be triggered by a number of inputs. Primarily atomization start will be triggered by the user of the atomizer, for instance when they wish to receive the benefits of aerosolized medication. It should be appreciated that in order to facilitate rapid and immediate atomization start on command by a user, fluid detection means may be incorporated into algorithms that consider a number of other variables. These algorithms may consider readiness of the fluid delivery system, whether or not it is the first use of a given fluid and priming is required or whether this is a restart of an existing session where the fluid delivery system is already primed, the type of fluid being atomized in the case different detection responses may translate into different startup routines to optimize atomization, or other variables that may be important to consider for a highly optimized atomization start.

In a typical start sequence, fluid may be introduced to the system via the fluid reservoir. Once the fluid reservoir is loaded and the system enabled, a priming sequence could be implemented which pumps fluid to the surface of the substrate. The proposed envelope detection method applied to voltage amplitude would determine when fluid arrives at the substrate and then signal the fluid delivery system that successful prime has been achieved. It is desirable that this priming sequence is done automatically once the fluid reservoir is filled and closed so that when the atomization start sequence is triggered, priming has already taken place and any time required to do so now prevented from delaying atomization start. When atomization start is triggered, it can be appreciated that depending on the time lapse between priming and atomization start, the trigger to shift to high power atomization mode may vary by the amount of time it takes for the appropriate amount of fluid to contact the surface of the substrate in the atomization area and cause the required shift in voltage amplitude. In other embodiments a passive or gravity fed system may be utilized. In this embodiment there is no intentional priming required but there may be time required for liquid to make it through liquid feed channels and to the surface of the atomization area. The proposed fluid detection system could also account for this type of "priming" where a passive system may need a small amount of time between when liquid is added to the reservoir and when it reaches the surface of the atomization area.

Similarly, it can be appreciated that this may also be helpful when the SAW atomizer turns off or returns to low power or standby mode. The most likely scenario would be when the fluid in the reservoir of the system is emptied and fluid is no longer delivered to the atomization area. The proposed fluid detection method could shift to low power mode when it detects a consistent change commensurate with low or negligible amounts of fluid on the substrate. Alternately, if an algorithm considered the optimal shutoff routine other variables may be considered relative to variables affecting or part of the design of the fluid delivery system. Counter to a priming sequence, it may also be preferred to run the atomizer when only intermittent fluid delivery is occurring, say when the fluid delivery system is emptying the last amounts of fluid from the system.

Like the priming sequence at startup, a shutdown sequence may be preferred to ensure that residual fluid does not remain in either the fluid delivery system or in the atomization area on the surface of the substrate. For instance, the fluid delivery system may have turned off but atomization may occur for a period of time after to ensure that all fluid in the atomization area has been atomized. Other reasons for variation in voltage amplitude could signify cause for turning off the SAW atomizer 300 or returning the low power mode. This could include problems with the fluid delivery system like a blockage or functional issue. In this case, to ensure overheating does not occur in the absence of fluid when it is meant to be there, the system could recognize and enter the low power state or possibly some altered power state that may be preferred under the condition of an intermittent or variable amount of fluid. As mentioned above, algorithms could be developed to ensure optimal atomization under known variables like changes in fluid delivery rate.

With respect to fluid delivery rate, the proposed solution for fluid detection could also be used as a closed loop system for informing the fluid delivery system regarding the required fluid delivery rate. As mentioned earlier, the voltage amplitude response of the SAW atomizer 300 is proportional to the amount of fluid in the atomization area. Given design parameters of the SAW atomizer 300, ideal operating conditions are likely to inform the ideal amount of fluid in the atomization area to ensure optimal atomization. This ideal amount of fluid can be translated into an optimal voltage amplitude response that, dynamically monitored, could be used to tell the fluid delivery system at which rate to deliver the fluid. The envelope detection outputs pertaining to voltage amplitude could be correlated to fluid flow and therefore actually inform the fluid delivery system as to what flow rate is required. The detection system could call for a higher fluid delivery rate if voltage amplitudes correlate to less than ideal fluid on the chip or conversely, lower fluid flow if voltage amplitudes suggest excessive fluid flow or fluid accumulation. Alternately, if the SAW atomizer 300 is atomizing at a rate that exceeds the rate provided by the fluid delivery system, in the case where the delivery rate of this system is fixed, envelope detection could inform a lowering of power or changes in other parameters intended to slow the atomization rate so that it matches the fluid delivery rate.

Other conditions affecting the atomization area may affect the atomization rate where it then becomes very important to ensure consistent and optimized atomization when all of these variables are considered. This includes the temperature and humidity of the local environment around the atomization area, the air flow rate over the atomization area, and the type of fluid being atomized. For any SAW atomizer 300, ensuring the optimal amount of fluid in the atomization area helps with optimal atomization. With respect to the type of fluid, a system can be envisioned whereby the type of fluid, or drug, to be atomized is known and pre-developed algorithms defining many aspects of atomization have been pre-programmed into the system. For instance, if a certain drug is known to have characteristics that would require a higher amount of power to the SAW atomizer 300 and therefore a different voltage amplitude response, then this is possible with the proposed system. It could be pre-programmed that the ideal conditions for atomization are unique for different fluids and therefore all aspects of fluid sensing could be adapted to be optimized for each fluid.

Conversely, the system may not have pre-programmed settings but rather an algorithm that understands the different variables that different fluids present and self optimizes based on voltage amplitude values, perhaps in combination with other inputs from the system, for instance a pressure sensor up stream of the pump that would relate to the viscosity of the fluid being delivered. Higher pressures correlating to lower viscosity and vice versa. Lastly, as it relates to fluid flow or issues preventing effective atomization and leading to an excess of fluid in the atomization area, a flooding condition is recognized. Flooding in the context of the fluid detection system would correlate an amount of fluid that when exceeded, no longer generates a change in voltage amplitude. In summary, having a closed loop control to ensure optimal fluid is present in the atomization area at all times and adjusted dynamically based on conditions affecting the atomizer is ideal. This not only leads to optimized atomization but also high efficiency so that power is delivered to the SAW atomizer precisely when it is needed.

Other variables may impact the voltage amplitude of the SAW atomizer 300 with a given amount of fluid present in the atomization area. Some fluids contain solids or solutes that can precipitate out of the fluid. These residues could alter the response of the SAW atomizer 300 if they were allowed to build up. As mentioned earlier, the system can adapt to the conditions of atomization which may include an atomization area that is partially covered in solid residues. Alternately, given other inputs, for instance from the fluid delivery system pertaining to a given flow rate of fluid to the atomization area, an algorithm may consider these residues as the cause of reduced atomization rate without any other identifiable cause. The fluid detection system may sense that fluid is building up in the atomization area where it should be able to atomize fully. In this case the system may determine that residue buildup has occurred and notify the user. This may require cleaning, some other step to resolve the residue buildup which may involve a self-cleaning cycle, or that the SAW atomizer 300 needs to be replaced. Other variables like wear or damage to the SAW atomizer 300, say if the substrate is cracked, pitted or chipped, may also lead to notification to the user to replace it. The envelope detection method may both detect fluid and track VSWR as a means of frequency adaptation.

Combination of Adaptive Frequency Control and Fluid Detection Methodologies

Figure 8:
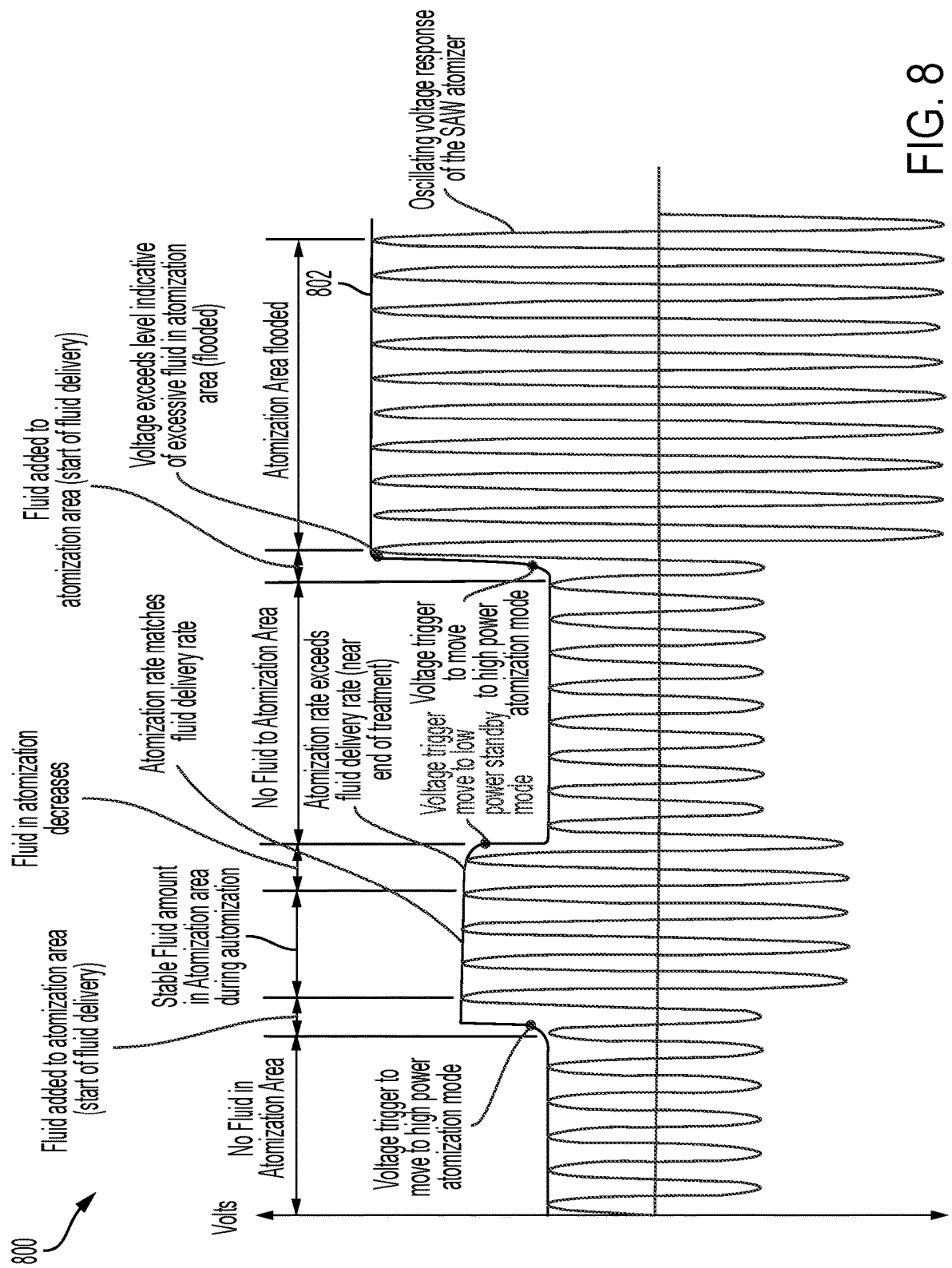
FIG. 8 is plot of a hypothetical oscillating voltage from a SAW atomizer with embodiments of fluid detection using an envelope detection method.

The proposed solutions for fluid detection and for adaptive frequency control can be implemented in a stand-alone fashion, where only one solution is implemented or they are independently implemented, or they may be implemented together and work in coordination as part of an algorithm that looks at both aspects to ensure optimized SAW atomizer performance. For instance, when liquid is introduced to the atomization area and comes into contact with the surface of the substrate, the resonant frequency changes. The fluid detection system proposed above, via envelope detection of voltage amplitude, can confirm whether fluid is present in the atomization area and possibly in what amount. The fluid delivery system via monitoring of fluid flow or some other related variable can confirm the fluid delivery rate to the atomization area. These combined can approximate atomization rate by confirming the fluid delivery rate needed to maintain the optimal fluid level in the atomization area. While atomization rate strongly correlates to the resonant frequency, which is detectable via the adaptable frequency approach disclosed above, approximating the fluid delivery rate can validate or augment the algorithm. In other words, the fluid detection system can confirm to the adaptive frequency control system that the chosen frequency indeed correlates to optimal aerosol output. A learning algorithm can adapt to compensate to an offset that considers variables presented by both systems to determine optimal parameters for aerosol output. FIG. 8 illustrates a hypothetical plot 800 of oscillating voltage from a SAW atomizer load 402 with embodiments of fluid detection using the above-noted envelope detection method, where the envelope 802 would be interpreted by the microcontroller 412 to inform the fluid delivery system feeding a fluid to the SAW atomizer 300 as to what flow rate is required.

The invention claimed is:

1. A system for automatically matching a dynamic impedance electrical load comprising:
   a load comprising a resonant acoustic micro-electromechanical systems (RA-MEMS) actuator;
   an amplifier circuit in communication with the load, the amplifier circuit further comprising a power supply input and a signal source input;
   a signal generating circuit comprising a tunable oscillator and having a generated signal output carrying a generated signal from the tunable oscillator, the generated signal output in communication with the signal source input of the amplifier circuit, wherein the signal generating circuit further comprises a frequency control input;
   a power supply detection circuit in communication with the power supply input of the amplifier circuit and configured to measure at least one of a voltage or a current supplied to the amplifier circuit; and
   a processor in communication with the power supply detection circuit and the frequency control input, the processor configured to:
   detect the at least one of the voltage or the current measured by the power supply detection circuit;

adjust a frequency of the signal generating circuit in response to the at least one of the voltage or the current measured to determine an initial frequency comprising a resonant frequency of the load; and periodically automatically readjust the frequency of the signal generating circuit in response to a determined change in the resonant frequency of the load.

2. The system of claim 1, wherein the RA-MEMS actuator comprises a surface acoustic wave (SAW) atomizer formed on a piezoelectric substrate.

3. The system of claim 2, wherein the surface acoustic wave (SAW) atomizer is configured with a power consumption characteristic wherein a signal input received at a resonant frequency of the SAW atomizer consumes less power than a signal input received at a frequency other than the resonant frequency of the SAW atomizer.

4. The system of claim 1, wherein the amplifier circuit comprises a class E amplifier.

5. The system of claim 1, wherein the processor is configured to adjust the frequency of the signal generating circuit in response to the at least one of the voltage or the current measured based on a hill climbing algorithm.

6. The system of claim 1, wherein the processor is configured to adjust the frequency of the signal generating circuit in response to the at least one of the voltage or the current measured utilizing a maximum power point tracking technique for iterating towards an impedance match between the amplifier circuit and the RA-MEMS actuator.

7. The system of claim 1, wherein processor is further configured to detect a presence of an amount of fluid at the RA-MEMS actuator based on a received measurement from an envelope detecting circuit sensing an envelope of a peak-to-peak voltage at the RA-MEMS actuator.

8. The system of claim 7, wherein the processor is further configured to switch the system between a low power mode and a high power mode based on the received measurement.

9. The system of claim 8, wherein the processor is further configured to switch the system to the low power mode, when a reduced amount of fluid is detected at the RA-MEMS actuator.

10. The system of claim 8, wherein the processor is further configured to adjust an atomization rate of based on the received measurement, wherein the low power mode reduces the atomization rate and the high power mode increases the atomization rate.

11. A method of matching a dynamic impedance electrical load comprising:

varying a frequency of a signal input to a dynamic impedance electrical load over a predetermined range at a first frequency increment;

while varying the frequency, detecting a power consumption of an amplifier supplying the signal input to the dynamic impedance electrical load at each of a plurality of frequencies in the predetermined range;

determining a resonant frequency for the dynamic impedance electrical load based exclusively on a frequency within the predetermined range where a minimum power consumption of the amplifier is detected; and maintaining the dynamic impedance electrical load at the minimum power consumption by automatically periodically varying the frequency of the signal input within the predetermined range at a second frequency increment to determine if the resonant frequency has changed based on detected power consumption and, in response to determining that the resonant frequency has changed, maintaining the signal input at the changed resonant frequency.

12. A system for automatically matching a dynamic impedance electrical load comprising:

a load comprising a dynamic impedance circuit;

an amplifier circuit in communication with the load, the amplifier circuit further comprising a power supply input and a signal source input;

a signal generating circuit comprising a tunable oscillator and having a generated signal output carrying a generated signal from the tunable oscillator, the generated signal output in communication with the signal source input of the amplifier circuit, wherein the signal generating circuit further comprises a frequency control input;

a power supply detection circuit in communication with the power supply input of the amplifier circuit and configured to measure at least one of a voltage or a current supplied to the amplifier circuit; and a processor in communication with the power supply detection circuit and the frequency control input, the processor configured to:

vary, via the frequency control input, a frequency of a signal input to the load over a predetermined range at a first frequency increment;

while varying the frequency, detect a power consumption of the amplifier circuit supplying the signal input to the dynamic impedance electrical load at each of a plurality of frequencies in the predetermined range;

determine a resonant frequency for the dynamic impedance electrical load based exclusively on a frequency within the predetermined range where a minimum power consumption of the amplifier circuit is detected; and maintain the dynamic impedance circuit at the minimum power consumption by automatically periodically varying the frequency of the signal input within the predetermined range at a second frequency increment to determine if the resonant frequency has changed based on detected power consumption and, in response to determining that the resonant frequency has changed, maintain the signal input at the changed resonant frequency.

13. The system of claim 12, wherein the amplifier circuit comprises a class E amplifier.

14. The system of claim 12, wherein the dynamic impedance circuit comprises a resonant acoustic micro-electromechanical systems (RA-MEMS) actuator.

15. The system of claim 14, wherein the RA-MEMS actuator comprises a surface acoustic wave (SAW) atomizer formed on a piezoelectric substrate.

16. The system of claim 14, wherein the processor is configured to adjust the frequency of the signal generating circuit in response to the at least one of the voltage or the current measured utilizing a maximum power point tracking technique for iterating towards an impedance match between the amplifier circuit and the RA-MEMS actuator.

17. The system of claim 14, wherein processor is further configured to detect a presence of an amount of fluid at the RA-MEMS actuator based on a received measurement from an envelope detecting circuit sensing an envelope of a peak-to-peak voltage at the RA-MEMS actuator.

18. The system of claim 17, wherein the processor is further configured to switch the system between a low power mode and a high power mode based on the received measurement.

19. The system of claim 18, wherein the processor is further configured to switch the system to the low power mode, when a reduced amount of fluid is detected at the RA-MEMS actuator.

\* \* \* \* \*